United States Patent [19]
Grasset

[11] Patent Number: 5,349,308
[45] Date of Patent: Sep. 20, 1994

[54] AMPLIFIER USING A FOLLOWER TRANSISTOR

[75] Inventor: Jean-Charles Grasset, Fontaine, France

[73] Assignee: Thomson-CSF Semiconducteurs Specifiques, Puteaux, France

[21] Appl. No.: 10,866

[22] Filed: Jan. 29, 1993

[30] Foreign Application Priority Data

Jan. 31, 1992 [FR] France .................. 92 01091

[51] Int. Cl.$^5$ ............................................. H03F 3/04
[52] U.S. Cl. ..................... 330/296; 330/288
[58] Field of Search ............... 330/261, 288, 296

[56] References Cited

U.S. PATENT DOCUMENTS

| | | | |
|---|---|---|---|
| 3,714,600 | 1/1973 | Kuijk et al. | 330/257 X |
| 4,575,685 | 3/1986 | Dobkin et al. | 330/261 |

FOREIGN PATENT DOCUMENTS

| | | |
|---|---|---|
| 0463857 | 1/1992 | European Pat. Off. |
| 2509013 | 9/1976 | Fed. Rep. of Germany |
| 96010 | 5/1985 | Japan .................. 330/296 |

*Primary Examiner*—James B. Mullins
*Attorney, Agent, or Firm*—Oblon, Spivak, McClelland, Maier & Neustadt

[57] ABSTRACT

The disclosure relates to amplifiers using emitter follower type transistors and, more particularly, to means for the biasing of these emitter followers. The amplifier includes a follower transistor, a biasing circuit injecting a base biasing current into the base of the follower transistor, a current generator connecting the emitter of the follower transistor to a supply potential. According to one characteristic, the biasing circuit includes, firstly, a transistor called an image transistor, the emitter of which is connected to the emitter of the follower transistor and, secondly, a current injector for the injection, into the base of the follower transistor, of a current constituting a replica of the base current of the image transistor. One of the advantages of this arrangement is that it can be used to obtain the biasing circuit with transistors that are all of a same type, NPN or PNP, as the follower transistor.

14 Claims, 2 Drawing Sheets

AMPLIFIER USING A FOLLOWER TRANSISTOR

BACKGROUND OF THE INVENTION

1. Field of the Invention

The invention relates to emitter follower type circuits also known as "common collector transistors", notably those made in the form of bipolar integrated circuits. It relates in particular to means for the polarization of emitter follower circuits.

2. Description of the Prior Art

The use of a bipolar transistor mounted as a "follower" (or "common collector") is very widespread, especially in analog electronic systems. Its chief characteristics are a voltage gain that is nearly unity, and a high current gain equal to B+1; B being the gain of the transistor equal to IC/IB (IC is the collector current, IB is the base current). The signal to be processed or input signal is applied to the base of the transistor and the corresponding output signal is delivered at the emitter. The variations of the output voltage VS on the emitter represent the input signal with a gain close to 1. The advantage of an assembly such as this is notably the fact that the output signal can be obtained with a high current. Its use sometimes raises difficulties, notably when it is sought to give a relatively high emitter bias current (often for reasons of speed constraints), which leads to the imposing of a base bias current which is itself relatively high.

FIGS. 1 and 2 use standard configurations to illustrate two cases where the voltage "read" at the base of the follower transistor is error-ridden because of the non-zero base current IB.

FIG. 1 illustrates the case of a voltage signal VG applied to the base B of a transistor T. The voltage signal VG is delivered by a voltage source SV. The corresponding output signal VS is delivered by the emitter E of the transistor T. The emitter E is connected to the ground potential by means of a current generator GI, in which there flows the emitter current IE of the transistor T. The collector C of the transistor T is connected to a supply potential VCC that is positive in relation to the ground.

The base current IB produces a voltage drop in the internal resistor RG of the source SV, in such a way that the voltage VB read at the base B is equal to VG-RG*IB.

FIG. 2 illustrates another example in which the capacitor Ca is positioned between the base of the follower transistor T and the ground. The transistor T is connected in a same way as in the above example as regards its collector C and its emitter E. This emitter represents a common configuration of follower transistors used for the reading of the sample-and-hold units. In a configuration such as this, the capacitor Ca is charged by a pulse at a voltage VG which decreases with time owing to the discharging of the capacitor C by the base current IB. The term used is that of the "drop-rate" of the voltage with reference to time.

A known way of circumventing the drawbacks related to the presence of the base bias current is to associate a bias circuit with the follower transistor, this bias circuit injecting an additional current into the base of the follower transistor. This additional current constitutes the base bias current which is thus not taken from the signal applied to the follower transistor.

It must be noted that the drawbacks illustrated with reference to FIGS. 1 and 2, due to the bias current in the base, also exist in the case of PNP type transistors.

FIG. 3 shows the diagram of a standard configuration associating a follower transistor T1 with a biasing circuit CP such as this.

As in the example of FIGS. 1 and 2, the collector C of the follower transistor T1 is connected to a first potential delivered by a voltage source with low internal resistance. This is a first voltage which, in the example, is a positive supply potential VCC. Its emitter E is connected to a second potential represented by the ground, by means of a current generator GI. The variations of the voltage VB on the base B of the follower transistor T1 are found again in the output voltage VS taken at the emitter E.

The current generator GI imposes an emitter current IE with the desired value on the follower transistor T1. To this emitter current IE there corresponds a base current IB injected by the biasing circuit CP.

The biasing circuit CP comprises two transistors T2, T3 mounted as a current mirror as well as a current generator circuit CGI. The current generator circuit imposes a collector current on the transistor T2. This collector current constitutes a replica IB' of the base current IB of the follower transistor T1.

This replica current is copied by the transistor T3 and injected into the base B of the follower transistor.

This constitutes an open-loop type of assembly that is easy to implement and that makes use, for the replica IB' of a transistor that is biased under conditions that are identical (or almost identical) to those of the follower transistor to be compensated for. Other assemblies are also used, but their implementation is more complicated. In these assemblies, a (closed) feedback loop is made, and this loop permanently compares the real base current and the replica current to make them equal.

These different assemblies have the common feature of using transistors of a type opposite that of the follower transistor to be biased, to obtain the base current IB to be injected into this follower transistor: for example, in the example of FIG. 3, the follower transistor T1 is of the NPN type while T2, T3 are of the PNP type. This is a first drawback when all that is available is a process with only one type of transistor. It must be recalled that, as a rule, making both PNP transistors and NPN transistors in one and the same process leads to an increase in manufacturing complexity and hence cost (especially if both types have to be matched in terms of speed). Another drawback, related to the types of biasing assemblies described here above, is that they have a parasitic collector capacitance at the input which causes deterioration in the characteristic input impedance of the assembly.

SUMMARY OF THE INVENTION

The present invention relates to any assembly (called an amplifier in the rest of the description) that makes use of at least one transistor mounted in "follower" mode, associated with a biasing circuit with a view to the injection, into the base of the follower transistor, of the base bias current.

The invention proposes a novel architecture that avoids the above-mentioned drawbacks and notably makes it possible to obtain the replica of the base bias current and to inject this current through the use of bipolar transistors of a same type as that of the follower transistor.

According to the invention, there is proposed an amplifier comprising a transistor called a follower transistor, having its collector taken to a first supply potential and its emitter connected to a second supply potential by means of a current generator, the follower transistor being biased by means of a biasing circuit, wherein the biasing circuit comprises, firstly, a transistor called an image transistor, the emitter current of which, called an image current, is a replica of the emitter current called the emitter bias current of the follower transistor, the emitter bias current and the image current going through the current generator, and wherein said biasing circuit comprises, secondly, means for the injection, into the base of the follower transistor, of a current constituting a replica of the base current of the image transistor.

The terms "first and second supply potentials" are used to define all potentials delivered by voltage sources comprising a low internal resistance, as is the case, for example, with supply potentials (for example VCC for a positive polarity and ground for a negative polarity of the supply voltage).

Furthermore, the expression "à replica of the current . . . . "should be understood to mean a current whose value is homothetical with the value of the current of which it is a replica, i.e. the two currents are related by a known ratio which is a function notably of the geometrical ratio between the two transistors: the two currents commonly have one and the same value when transistors of the same type have a same geometry.

BRIEF DESCRIPTION OF THE DRAWINGS

The invention will be understood more clearly from the following description, and from the appended drawings, of which.

DETAILED DESCRIPTION OF THE INVENTION

Figure 4:
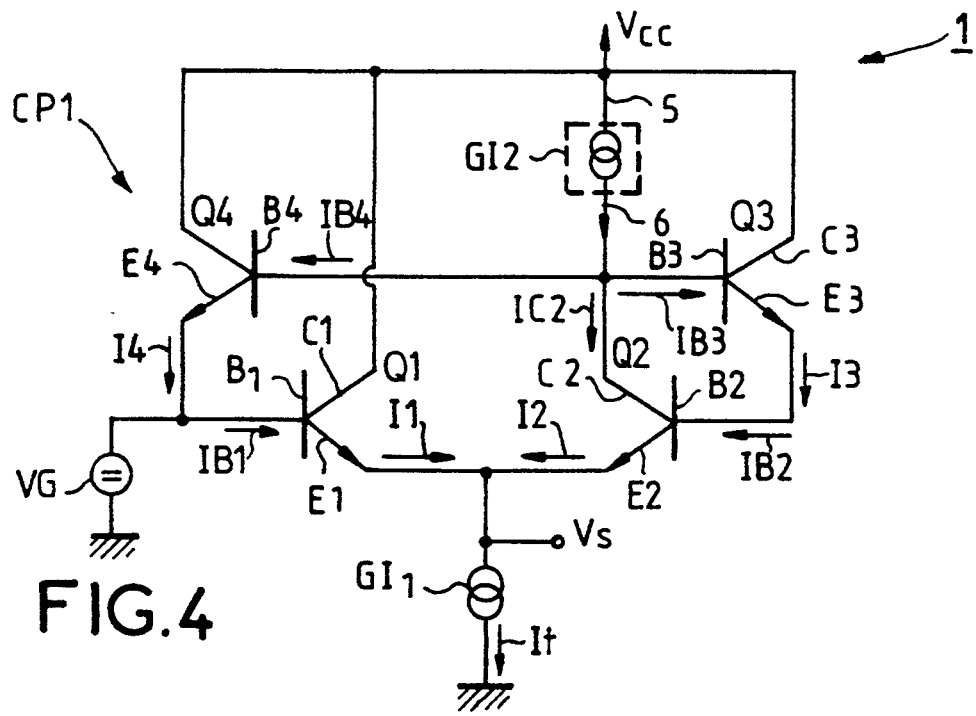
FIG. 4 is a diagram showing an amplifier formed by a follower transistor associated with a biasing circuit according to the invention.

FIG. 4 shows an amplifier 1 comprising a bipolar transistor Q1 forming a follower transistor that has functions similar to those explained in the introduction. In the non-restrictive example described, the follower transistor Q1 is of the NPN type, and consequently its collector C1 is carried to a positive potential with respect to the potential to which its emitter E1 is taken. In the example, firstly, the emitter E1 is connected to a current generator $GI_1$ which is itself connected to the ground and, secondly, the collector C1 is directly connected to a positive supply potential VCC.

In a standard way, the base B1 of the follower transistor receives an input signal coming from a source VG, and it is furthermore connected to a biasing circuit $CP_1$ from which it receives a current $IB_4$ which constitutes its base bias current $IB_1$.

According to a characteristic of the invention, firstly, the biasing circuit CP1 comprises a transistor Q2 called an image transistor, of a same type as the follower transistor Q1, namely NPN in the example, the emitter current I2 of which, called an image emitter current, is a replica of the emitter current I1 of the follower transistor Q1, which is a current called the emitter bias current; and secondly, the current generator $GI_1$ imposes a so-called total current It, the value of which is equal to the sum $(IE_1+IE_2)$ of the emitter bias current I1 and of the image current I2. Furthermore, according to another characteristic of the invention, the bias current I4 injected into the base $B_1$ of the follower transistor Q1 constitutes a replica of the base current $IB_2$ of the image transistor Q2.

In the non-restrictive example described, the two emitter currents, namely the bias current I1 and the image current I2, and consequently the two base currents $IB_2$, $IB_2$, are identical, the follower transistor Q1 and the image transistor Q2 being paired and furthermore having, in a manner that is standard per se, a same geometry.

Figure 1:
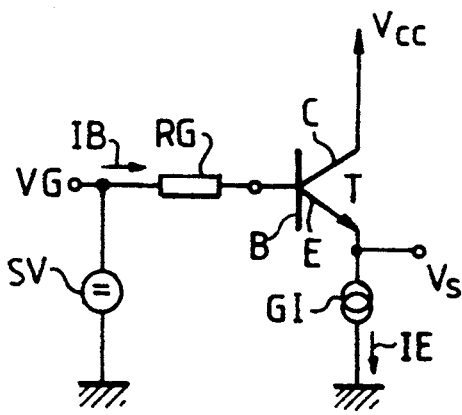
FIGS. 1 and 2, already described, illustrate the working of a transistor mounted in "follower" mode.
Figure 2:
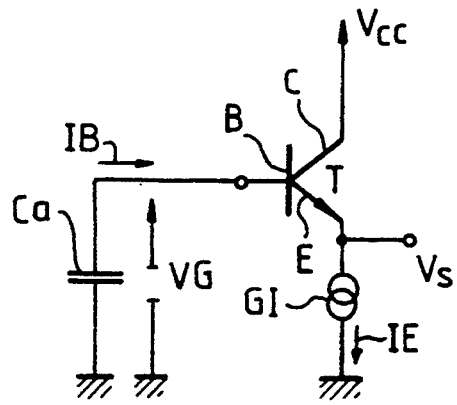

The image current I2, more specifically the collector current $IC_2$ of the image transistor Q2, is imposed by a second current generator device $GI_2$, this being a function that can more generally be fulfilled by an active load. In the non-restrictive example of FIG. 1, a first end 5 of the second current generator or active load $GI_2$ is connected to the first supply potential VCC (positive) and its opposite end 6 is connected, all at once, to the collector C2 of the image transistor Q2, the base B3 of a third transistor Q3 and the base B4 of a fourth transistor Q4. All these transistors Q2, Q3, Q4 are of a same type as the follower transistor Q1, namely NPN in the example.

The third transistor Q3 has its collector C3 connected to its positive supply potential VCC, and it has its emitter E3 connected to the base B2 of the image transistor Q2. The emitter current I3 of the third transistor Q3 is constituted by the base current $IB_2$ of the image transistor Q2.

The fourth transistor Q4 has its emitter E4 connected to the base B1 of the follower transistor Q1, and its collector is carried to the positive supply potential VCC.

The third and fourth transistors Q3 and Q4 are paired and have a same geometry, in such a way that the current I4 of the fourth transistor Q4 copies the current of the third transistor Q3, namely the value I2/( B+1), B being the gain of the image transistor Q2. Since I1=I2, we have I4=I1 / (B+1), namely the desired value to cancel the base current of Q1.

With respect to the loop formed by the four transistors Q1, Q2, Q3 and Q4, the following may be written (assuming that these four transistors have a same saturation current):

$$VBE4+VBE1-VBE2-VBE3=0,$$

giving (I4*I1) / (I2*I3)=1, where VBE4, VBE3, VBE2 and VBE1 are respectively the base-emitter voltages of the fourth, third, second and first transistors Q4, Q3, Q2, Q1.

The following can be deduced therefrom: I4=I2*I3/I1=I1 /(B+1), for I3=I2 /(B+1), and I2=I1 ; I4, I3, I2 and I1 respectively corresponding to the emitter current of Q4, Q3, Q2 and Q1.

In the example of the explanations given here above, where the emitter bias current and image current I1 and I2 have one and the same value, the first current generator $GI_1$ (connected to the two emitters E1, E2) dictates a total current $I_t$ which is twice the current $IC_2$ that is dictated by the means used to constitute the second current generator GI$_2$. In fact, the second current generator GI$_2$ defines a current IC$_2$ in the image branch which contains the image transistor Q2, and the first current generator GI$_1$ defines the total current I$_t$ (I$_t$ being equal to IC$_1$+IC$_2$, plus or minus the base currents of the transistors Q1 and Q2) in a section that is common to the image branch and to the branch containing the follower transistor Q1 (IC$_1$ being the collector current of Q1).

Figure 3:
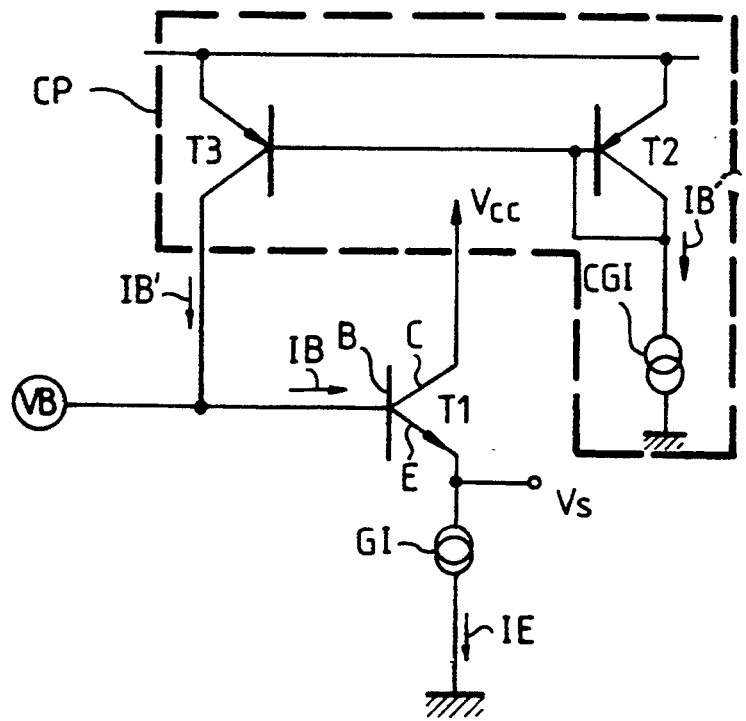
FIG. 3 is a diagram showing a prior art biased follower transistor.

It is also possible to achieve the general configuration of FIG. 3 with emitter currents I1, I2 by a ratio n, (I2/I1=n) provided that adjustments are made, accordingly, to the currents dictated by the current generators GI1, GI2 and to the geometries of the transistors Q2 and Q3, by a ratio n with the unitary geometries of Q1 and Q4.

The precision of the compensation depends, among other factors, on the conditions of bias of the transistors Q1 to Q4, more specifically, on the one hand, on the differences in bias (emitter current, collector-emitter voltage) between the follower transistor Q1 and the image transistor Q2 and, on the other hand, the differences in bias between the third and fourth transistors Q3, Q4 as well as on the random errors of offset of the transistors.

Naturally, the diagram shown in FIG. 4 using transistors Q1 to Q4 that are all of a same type (NPN in the example) can be transposed without difficulty to a configuration with transistors that are all of the PNP type.

The configuration of the invention has the major advantage, as compared with the prior art, of setting up a bias compensation circuit CP which does not require the use, in all cases, of PNP type transistors, given the numerous defects of these transistors when used in standard applications (lateral PNP).

However, the approach of the invention is promising also in that it uses only one type of transistor, notably a transistor emitter to inject the base bias current of the follower transistor: this brings very little parasitic capacitance back to the input of the assembly.

Figure 5:
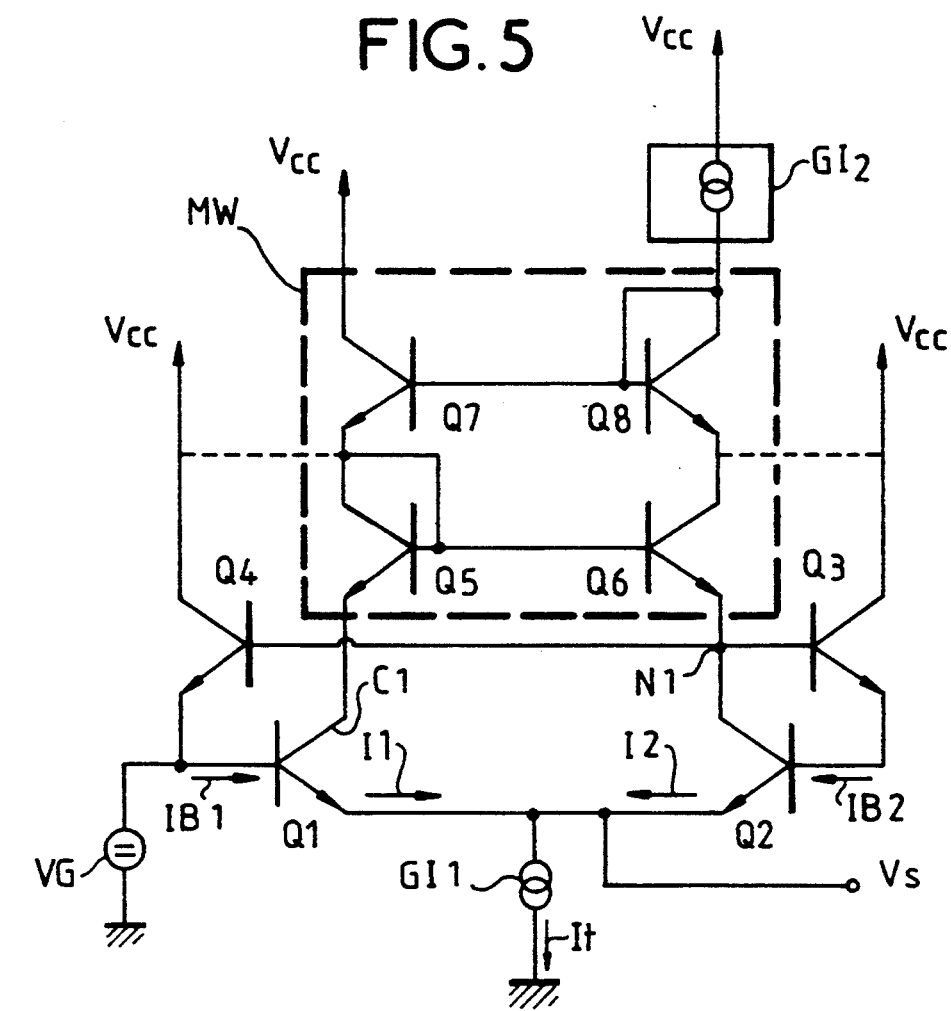
FIG. 5 illustrates a preferred embodiment of an amplifier according to the invention.

FIG. 5 is a diagram showing a preferred embodiment of an amplifier 10 according to the invention.

The follower transistor Q1, the image transistor Q2, the third and fourth transistors Q3, Q4 and also the fourth current generator GI$_1$ are in a same general configuration as the one shown in FIG. 4, and work similarly.

However, as compared with the version of FIG. 4, the version of FIG. 5 is different in that the bias circuit CP 10 furthermore comprises a Wilson mirror type circuit MW that is well known per se. The "Wilson mirror" circuit MW enables the follower transistor Q1 and the image transistor Q2 to be made to work under the same conditions of emitter-collector voltage (VCE) without any appreciable disequilibrium of the collector currents IC1 and IC2. Consequently, the offset error of the collector currents IC1 and IC2 attains values in the range of 1/B$^2$ while this error is in the range of 1/B in the case of FIG. 4.

To this end, firstly the means GI$_2$ used to impose the collector current IC$_2$ of the image transistor Q2 (means constituted for example by an active load) and secondly the first potential VCC are connected respectively to the collector C2 of the image transistor Q2 and to the collector C1 of the follower transistor Q1 by means of the Wilson mirror MW.

In a standard way, the Wilson mirror MW comprises four transistors known as fifth, sixth, seventh and eighth transistors Q5, Q6, Q7, Q8.

The active load GI$_2$ is connected by one end to the supply potential VCC, and by its other end, it is connected both to the collector and to the base of the eighth transistor Q8 (the eighth transistor being diode-mounted) as well as to the base of the seventh transistor Q7. The emitter of the eighth transistor Q8 is connected to the collector of the sixth transistor Q6.

The collector of the seventh transistor Q7 is connected to the first potential VCC, and the emitter of this seventh transistor is connected both to the collector and to the base of the fifth transistor Q5 (this transistor being diode-mounted) as well as to the base of the sixth transistor Q6.

Finally, the emitter of the fifth transistor Q5 is connected to the collector of the follower transistor Q1, and the emitter of the sixth transistor Q6 is connected to the node N1 formed by the point at which the collector of the image transistor Q2 and the bases of the third and fourth transistors Q3, Q4 are connected together.

Furthermore, the bias error of the emitter currents I1, I2 due to the base current IB$_1$, IB$_2$ of the follower and image transistors Q1, Q2 can be reduced to a negligible magnitude (I/B$^2$ instead of I/B, B being the gain in current of the transistors), by connecting the collectors of the third and fourth transistors Q3, Q4 respectively to the emitter of the seventh transistor Q7 and to the emitter of the eighth transistor Q8, as shown in FIG. 5 by connections represented by dashes, instead of connecting them directly to the supply potential VCC. This furthermore makes it possible to preserve the equality of the collector-emitter voltages (VCE) of the third and fourth transistors Q3, Q4.

It must be noted that the invention is applicable irrespectively of the nature of the active load or loads used, and that it is particularly well suited, when there are no PNP transistors available, to the use of an active load with feedback (all NPN) which furthermore possesses promising speed characteristics.

Tests on a circuit similar to that of FIG. 5 (using a fast NPN bipolar technology) have been carried out in giving:

the voltage between ground and VCC: a value of 10 volts;

the total current I$_t$ in the first current generator GI$_1$: a value equal to 200 μA;

the current IC$_2$ in the active load" a value of 100 μA;

whence a base bias current IB in the follower current Q1 of the order of 746 nA (746$^1$10$^{-9}$ A). Thus, with an input current IE taken from an input signal applied to the input of the follower Q1, i.e. to the base B1, of the order of 5 nA, seen from the input signal, there is the equivalent of the division of the base current by 150.

What is claimed is:

1. An amplifier for receiving an input signal and delivering an output signal, comprising:
 a biasing circuit;
 a transistor called a follower transistor, having its collector connected to a first supply potential and its emitter connected to a second supply potential by a current generator, the follower transistor delivering, at its emitter, said output signal that corresponds to said input signal applied to its base, the follower transistor being biased by the biasing circuit;
 wherein the biasing circuit includes:

a transistor called an image transistor, the emitter current of which, called an image current, is a replica of the emitter current called the emitter bias current of the follower transistor, the emitter bias current and the image current going through the current generator;

means for injecting into the base of the follower transistor a current constituting a replica of the base current of the image transistor; and means for setting the emitter current of the image transistor to the difference between the total current imposed by the current generator and the emitter bias current of the follower transistor.

2. An amplifier device according to claim 1, wherein the image transistor is of a same type (NPN) as the follower transistor.

3. An amplifier device according to claim 2, wherein the emitters of the follower transistor and of the image transistor are connected together.

4. An amplifier device according to claim 1, wherein the image transistor and the follower transistor are paired.

5. An amplifier device according to any one of claims 1, 2, 3 and 4, wherein the emitter bias current and the image current have a same value.

6. An amplifier comprising:

a biasing circuit;

a transistor called a follower transistor, having its collector connected to a first supply potential and its emitter connected to a second supply potential by a current generator, the follower transistor delivering, at its emitter, an output signal that corresponds to an input signal applied to its base, the following transistor being biased by the biasing circuit;

wherein the biasing circuit includes:

a transistor called an image transistor, the emitter current of which, called an image current, is a replica of the emitter current called the emitter bias current of the follower transistor, the emitter bias current and the image current going through the current generator; and means for injecting into the base of the follower transistor a current constituting a replica of the base current of the image transistor;

wherein said amplifier further comprises a third transistor and a fourth transistor mounted in common collector mode, the bases of said third and fourth transistors being connected to the collector of the image transistor, the emitter of the third transistor being connected to the base of the image transistor and the emitter of the fourth transistor being connected to the base of the follower transistor.

7. An amplifier device according to claim 6, wherein the image transistor and the third and fourth transistors are of a same type (NPN) as the follower transistor.

8. An amplifier device according to either of the claims 6 or 7, wherein the third and the fourth transistors are paired.

9. An amplifier device according to either of the claims 6 or 7, wherein the follower transistor, the image transistor and the third and fourth transistors are all of the NPN type.

10. An amplifier device according to any one of claims 1 or 6, wherein the biasing circuit comprises a Wilson mirror type of circuit.

11. An amplifier device according to any one of the claims 1 or 6, wherein the biasing circuit further includes a Wilson mirror type of circuit connecting the image transistor to the means for setting the emitter current.

12. An amplifier device according to any one of the claims 1 or 6, wherein the means for injecting includes an active load.

13. An amplifier according to any one of the claims 1 or 6, wherein the second supply potential is ground.

14. An amplifier according to claim 6, wherein said amplifier has an input and an output, said input and said output respectively being said base and said emitter of said follower transistor.

* * * * *